(12) United States Patent
Dehé et al.

(10) Patent No.: US 7,882,612 B2
(45) Date of Patent: Feb. 8, 2011

(54) METHOD FOR PRODUCING A MEMBRANE

(75) Inventors: Alfons Dehé, Neufahrn (DE); Stefan Barzen, München (DE); Marc Fueldner, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 159 days.

(21) Appl. No.: 12/378,878

(22) Filed: Feb. 21, 2009

(65) Prior Publication Data

US 2009/0162534 A1 Jun. 25, 2009

Related U.S. Application Data

(60) Division of application No. 11/104,396, filed on Apr. 11, 2005, now Pat. No. 7,502,482, which is a continuation of application No. PCT/EP03/11204, filed on Oct. 9, 2003.

(30) Foreign Application Priority Data

Oct. 11, 2002 (DE) ................. 102 47 487

(51) Int. Cl.
H04R 31/00 (2006.01)
(52) U.S. Cl. ................. 29/594; 29/592.1; 29/609.1; 264/320; 264/544; 381/396; 381/398
(58) Field of Classification Search ................. 29/592.1, 29/594, 609.1; 181/171, 172; 264/320, 544; 381/396, 398
See application file for complete search history.

(56) References Cited

U.S. PATENT DOCUMENTS

| 5,194,402 | A | * | 3/1993 | Ehrfeld et al. | ................. 438/50 |
| 5,576,250 | A | * | 11/1996 | Diem et al. | ................. 438/50 |
| 6,724,058 | B2 | * | 4/2004 | Aigner et al. | ................. 257/415 |
| 7,502,482 | B2 | | 3/2009 | Dehe et al. | |

FOREIGN PATENT DOCUMENTS

| CN | 1703932 A | 11/2005 |
| WO | 0238491 A1 | 5/2002 |

OTHER PUBLICATIONS

Zou Quanbo et al., Fabrication of a Novel Structural Miniature Silicon Condenser Microphone, article, Feb. 1997, vol. 25, No. 2, China Academic Journal Electronic Publishing House, China.

* cited by examiner

*Primary Examiner*—Paul D Kim
(74) *Attorney, Agent, or Firm*—Maginot, Moore & Beck

(57) ABSTRACT

A method for producing a membrane for a device, e.g. a microphone, includes providing a substrate is provided on which a counter electrode is disposed. A sacrificial layer is provided on a surface of the counter electrode facing away from the substrate. The surface of the sacrificial layer facing away from the counter electrode is structured to form a plurality of recesses in the surface to define one or several antistick elements and one or several corrugation grooves at the same time. Subsequently, a membrane material is deposited on the structured surface of the sacrificial layer. Then, the sacrificial layer is removed to form the membrane, which has one or several corrugation grooves and one or several antistick elements.

17 Claims, 7 Drawing Sheets

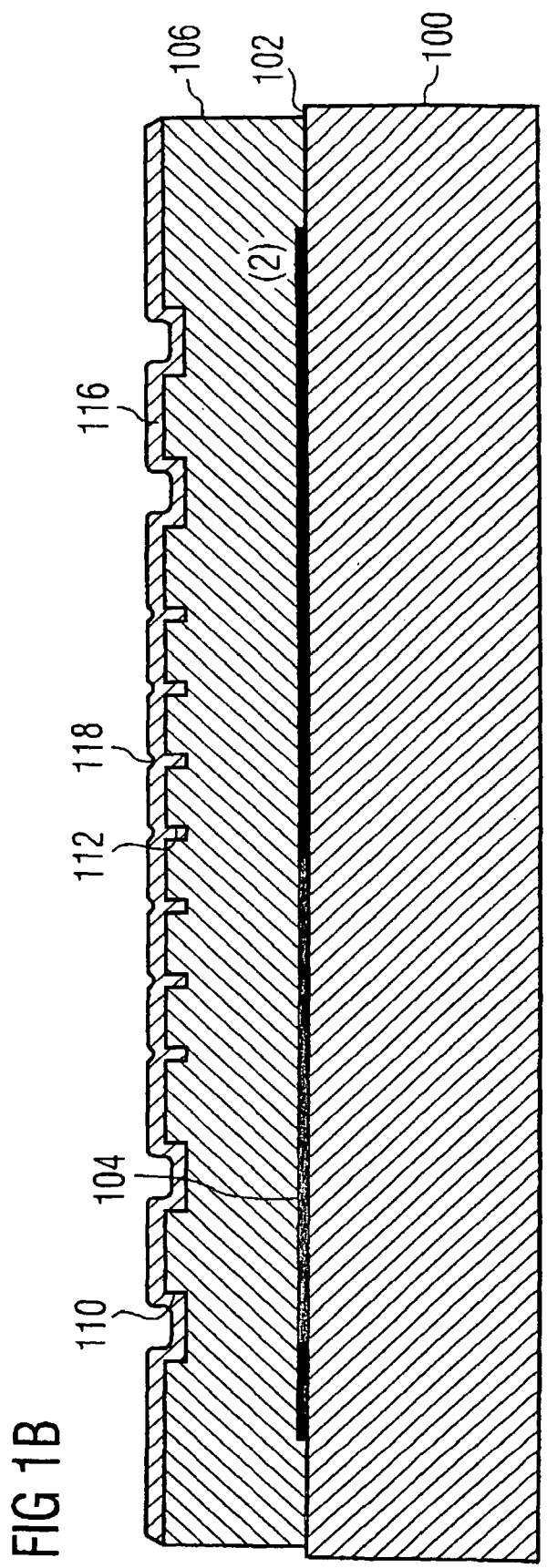

METHOD FOR PRODUCING A MEMBRANE

CROSS-REFERENCE TO RELATED APPLICATIONS

This application is a divisional of U.S. patent application Ser. No. 11/104,396, filed Apr. 11, 2005, now U.S. Pat. No. 7,502,482 which is incorporated herein by reference, and which is a continuation of International Application No. PCT/EP03/11204, filed Oct. 9, 2003.

BACKGROUND OF THE INVENTION

1. Field of the Invention

The present invention relates to a membrane and to a method for the production of the same, and here particularly to a membrane with corrugation grooves and antistick elements as well as to a method for producing the same. Particularly, the present invention relates to a membrane for a microphone, for example a silicon microphone.

2. Description of the Related Art

The center element of a micromechanically realized silicon microphone is the membrane used therein, which is to vibrate in the sound field. One prerequisite for this membrane is that it is as sensitive as possible, but it may not stick to the counter electrode in strong deflections and a resulting contact with the counter electrode. Such strong deflections are caused, for example, by high sound levels, an electrostatic attraction or the surface tension of fluids.

In the prior art, several approaches are known to improve, on the one hand, the sensitivity of the membrane and to avoid, on the other hand, sticking of the membrane.

One approach for optimizing the sensitivity is to optimize the layer properties and the lateral design of the membrane, for example by so called spring membranes. However, this approach is disadvantageous in that the reduced area of the membrane resulting from the optimization also lowers the capacity of the membrane.

A further approach for improving the sensitivity of a membrane for a silicon microphone is to provide so-called corrugation grooves in the membrane. One such approach is described, for example, by Zou, Quanbo et al. in "Design and Fabrication of Silicon Condenser Microphone Using Corrugated Diaphragm Technique" in Journal of Microelectromechanical Systems, Vol. 5, No. 3, September 1996. According to this approach, V-shaped trenches are formed in a silicon substrate to generate the desired corrugation grooves in the subsequent formation of the membrane.

One approach for avoiding an irreversible sticking of the membrane to a counter electrode is to produce so called antistick elements (antistick bumps/dimples). These antistick elements are needle-type structures in the membrane, which reduce the contact region during contact with the counter electrode significantly, as it is described by Brauer, et al. in "Silicon Microphone Based on Surface and Bulk Micromachining", Journal of Micromechanics and Microengineering, 11 (2001), pp. 319-322. It is the disadvantage of this approach that the production of the needle-type structures means additional process effort.

With regard to the solutions known in the prior art, it has to be noted that they teach independent processes, on the one hand for generating the antistick elements and, on the other hand, for increasing the sensitivity of the membrane.

SUMMARY OF THE INVENTION

It is an object of at least some embodiments of the present invention to provide an improved method for producing a membrane as well as an improved device, wherein both a sensitivity of the membrane can be improved and sticking of the membrane to a counter electrode is avoided with reduced process technical production effort.

In accordance with a first aspect, the present invention provides a method for producing a membrane for a device, having the following steps: (a) providing a substrate, whereon a counter electrode is disposed, wherein a sacrificial layer is disposed on the surface of the counter electrode facing away from the substrate; (b) structuring the surface of the sacrificial layer facing away from the counter electrode to form a plurality of recesses in the surface to define one or several antistick elements and one or several corrugation grooves at the same time; (c) depositing a membrane material on the structured surface of the sacrificial layer; and (d) removing the sacrificial layer to form the membrane having one or several corrugation grooves and one or several antistick elements.

According to a preferred embodiment of the present invention, the antistick elements are defined in a region of the sacrificial layer, which opposes a central region of the counter electrode. In this embodiment, the corrugation grooves are defined in a region of the sacrificial layer opposing an edge region of the counter electrode, so that during a deflection of the membrane towards the counter electrode merely the one or several antistick elements come into contact with the counter electrode.

According to a further preferred embodiment of the present invention, a further sacrificial layer is deposited on the structured surface after structuring the sacrificial layer, with a thickness, which is low compared to a thickness of the sacrificial layer, so that the structured surface of the sacrificial layer is mapped to the surface of the further sacrificial layer facing away from the sacrificial layer, wherein the membrane material is deposited on the structured surface of the further sacrificial layer in step (c) and, additionally, the further sacrificial layer is removed in step (d).

Preferably, the sacrificial layer is removed in step (d) such that a portion of the sacrificial layer remains in a region outside the counter electrode to define a structure supporting the membrane spaced apart from the counter electrode.

Preferably, the corrugation grooves are structured such that they are self-contained and surround the antistick elements, wherein the corrugation grooves can be defined in a circular way, in a traverse way or in any other form.

Preferably, the recesses defining the antistick elements have a lateral dimension, which is small compared to a lateral dimension of the recesses defining the corrugation grooves, so that when depositing the membrane material or the further sacrificial layer, the recesses defining the antistick elements will be closed again fully or almost fully—depending on the desired form of the bump.

In accordance with a second aspect, the present invention provides a device, having: a substrate, a counter electrode disposed on the substrate; a membrane supported spaced apart from the counter electrode to be opposed to the counter electrode, wherein the membrane has one or several antistick elements in a central region of the membrane and one or several corrugation grooves in an edge region of the membrane surrounding the central region, so that during a deflection of the membrane to the counter electrode merely the antistick elements will come into contact with the counter electrode.

The device is preferably a microphone, for example a silicon microphone, and the membrane is the microphone membrane. Alternatively, the device can also be a pressure sensor.

It is the advantage of the present invention that the sensitivity is only improved by one or several corrugation grooves in the membrane, wherein the corrugation grooves form a vertical surrounding wave structure in the membrane. According to the invention, therefore, one or several ring structures (corrugation grooves) and one or several hole structures (bumps, antistick elements) are defined in the sacrificial oxide layer determining the gap distance in the condenser microphone, which model into the membrane during the deposition of the same to result in the desired structure.

According to the invention, an improvement of the production method is obtained by producing the corrugation grooves and the antistick elements at the same time in one process step, so that the disadvantages in the prior art requiring different methods and production processes for the production of the corrugation grooves and for the production of the antistick elements, respectively, are avoided.

It is an advantage of the present invention that corrugation grooves are now generated with the same technology, with which so far the antistick elements have been generated, so that no additional process steps are required according to the invention.

Since the area of the membrane is not structured and thus decreased for increasing the sensitivity, the capacity is fully maintained.

The increase in sensitivity of the inventive corrugated membrane can be compared with the one obtained with feather membranes, but can additionally be adjusted by the number of corrugation grooves.

BRIEF DESCRIPTION OF THE DRAWINGS

These and other objects and features of the present invention will become clear from the following description taken in conjunction with the accompanying drawings, in which:

FIGS. 1A-1D are an embodiment for producing a microphone membrane according to the present invention;

DESCRIPTION OF THE PREFERRED EMBODIMENTS

Figure 1A:
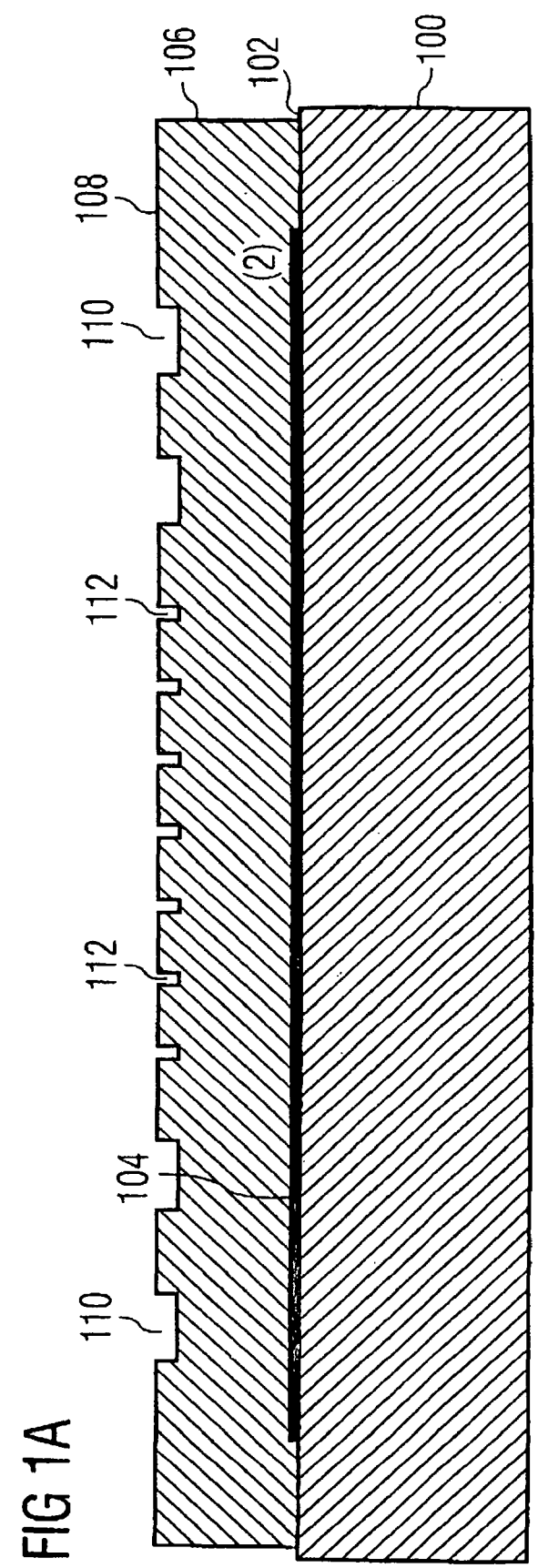

In the following, an embodiment of the present invention for producing a silicon microphone will be discussed in more detail with reference to FIGS. 1A to 1D, wherein the production of a membrane with antistick elements (bumps) and corrugation grooves is illustrated below. The membrane can be part of a capacitive microphone, wherein the membrane forms an electrode of the disc capacitor, and a second static electrode is disposed below the same. In FIG. 1A, a substrate 100 having a first main surface 102 is shown. On the main surface 102 of the substrate 100, a counter electrode 104 is formed at least partly. A first sacrificial oxide layer 106 is disposed on a surface of the counter electrode 104 facing away from the substrate 100, wherein it is formed in the embodiment shown in FIG. 1A such that it covers the counter electrode 104 fully and further extends to the first main surface 102 of the substrate 100.

In a surface 108 of the first sacrificial oxide layer 106 facing away from the substrate 100, a first plurality of recesses 110 as well as a second plurality of recesses 112 are formed, wherein, for clarity reasons, merely individual ones of the recesses are provided with reference numbers in FIG. 1A. The recesses 110, 112 are introduced into the surface 108 of the first sacrificial oxide layer 106 by an appropriate etching procedure, wherein the recesses 110 are structured to define the structures for the corrugation grooves to be formed in the membrane. The recesses 112 are defined to define the structures for the antistick elements provided in the membrane. The lateral geometry of the recesses 110, 112 is chosen such that the recesses 112 for the definition of the antistick elements are so narrow, for example in the range of 1 µm, that the recesses 112 will be almost closed again in a subsequent oxide deposition, for example with a thickness of about 600 nm. Thus, the lateral dimension of the recesses 112 is approximately in the range of the thickness of the oxide layer to be disposed subsequently. In comparison, the recesses 110 for defining the corrugation grooves are designed significantly broader than the thickness of a subsequent layer generated by an oxide deposition, wherein the dimension of the recesses 110 can, for example, be 5 µm.

As has been shown in FIG. 1B, a second sacrificial oxide layer 116 is deposited on the structured surface 108 of the first sacrificial oxide layer in order to round the structure as shown in FIG. 1A. The thickness of the second sacrificial oxide layer 116 is low compared to the thickness of the first sacrificial oxide layer and is about 600 nm in the illustrated embodiment. As has been described above with reference to FIG. 1A, the dimensions of the recesses 112 for defining the antistick elements are chosen such that the lateral dimension of the recesses 112 is in the range of the thickness of the further sacrificial oxide layer 116. This leads to the fact that after depositing the second sacrificial oxide layer 116 only a sharp cavity remains of the recesses 112, the so-called bump holes, as it is shown in FIG. 1B by the reference number 118.

Due to the dimension of the recesses 110 for defining the corrugation grooves in the surface 108 of the first sacrificial oxide layer 116, which is significantly larger than the thickness of the oxide layer 116, a corresponding mapping of the recesses 110 into the second sacrificial oxide layer 116 results.

Figure 1C:
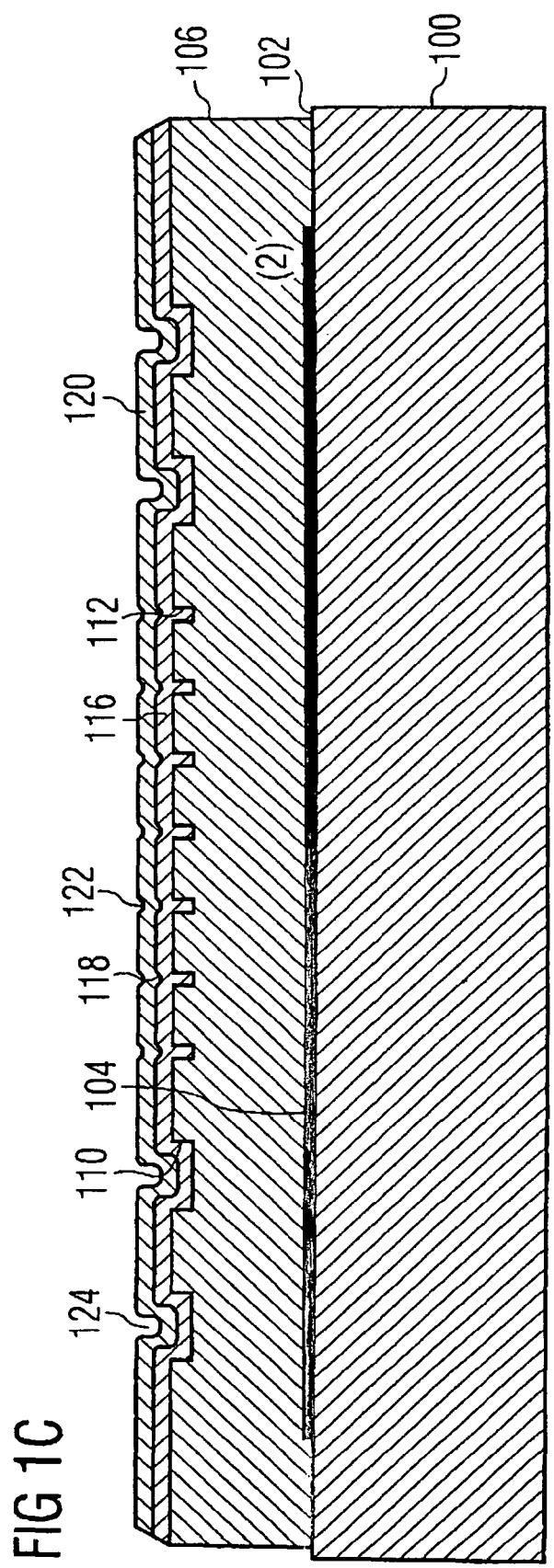

In a subsequent step, as shown in FIG. 1C, the membrane material is deposited to generate the membrane 120. In the illustrated embodiment, the membrane material for generating the membrane 120 is deposited with a thickness of about 200 nm. As illustrated in FIG. 1C by reference number 122, the cavities 118 formed in the second sacrificial oxide layer 116 are also mapped into the membrane 120 during the deposition of the membrane material. At the same time, the corrugation grooves 124 form in the membrane in the surface of the sacrificial oxide layer 116 due to the deposition under the definition of the recesses 110.

Figure 1D:
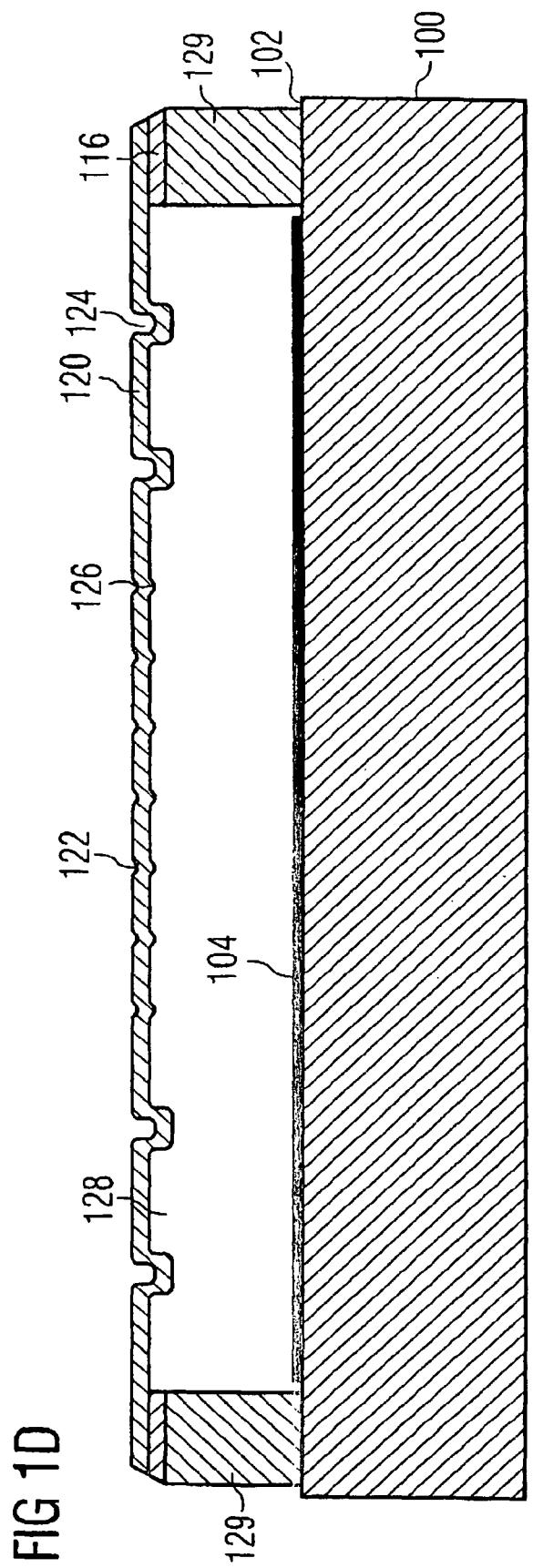

In a final method step, the first sacrificial oxide layer 106 and the second sacrificial oxide layer 116 are partly removed, for example by an appropriate etching process, so that the structure with a cavity 128 between the membrane 120 and the substrate 100 and the counter electrode 104, respectively, shown in FIG. 1D results. The sacrificial layers 106 and 116 are removed such that a portion of the sacrificial layers remains in a region outside the counter electrode 104 to define a structure 129 supporting the membrane 120 spaced apart from the counter electrode 104. As can be seen in FIG. 1D, due to the removal of the sacrificial oxide layers 106, 116, the arrangement with the membrane 120 comprising the corrugation grooves 124 as well as a plurality of antistick elements (anti sticking bumps) 126 results.

According to the invention, a microphone membrane has been generated in a simple way, which, on the one hand, has an improved sensitivity due to the corrugation grooves, and, on the other hand, does not stick to the counter electrode in a deflection towards the same, due to the provided antistick elements. As has been described above, it is the advantage of the invention that no different production processes are required for generating the corrugation grooves and antisticking bumps, but that the same can be generated in a common production step according to the invention.

In the embodiment shown in FIG. 1, a structure results, which forms a silicon microphone, where the antistick elements are disposed in a central region of the membrane 120, wherein the corrugation grooves 124 are disposed in an edge region of the membrane 120, which surrounds the central region with the antistick elements and is further connected to the support structure 129. This structure has the effect that during a strong deflection of the membrane 120 the central region with the antistick elements 126 can be deflected so far that it comes into contact with the counter electrode 104, wherein here an adhesion is avoided since the contact region is sufficiently reduced due to the provided antistick elements 126.

Figure 2A:
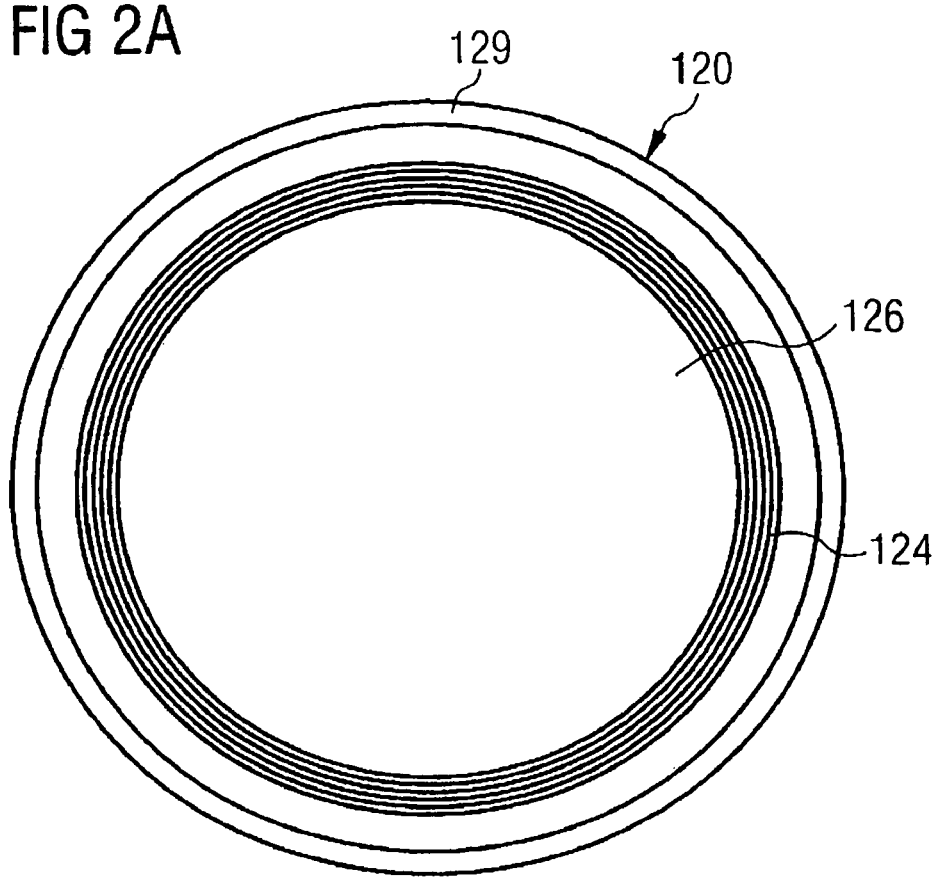
FIG. 2A is a top view of the microphone membrane produced according to the method described in FIG. 1.

In FIG. 2A, a top view of the membrane 120 is shown, which has been produced according to the method described in FIG. 1.

As can be seen in FIG. 2A, the membrane 120 as well as the support structure 120 are designed in a circular way, and also the substrate not shown in FIG. 2A. The six corrugation grooves 124 in the edge region of the membrane 120 are formed in a circular way and are self-contained structures, wherein the inner corrugation groove surrounds the antistick elements 126 in the central region of the membrane 120.

Figure 2B:
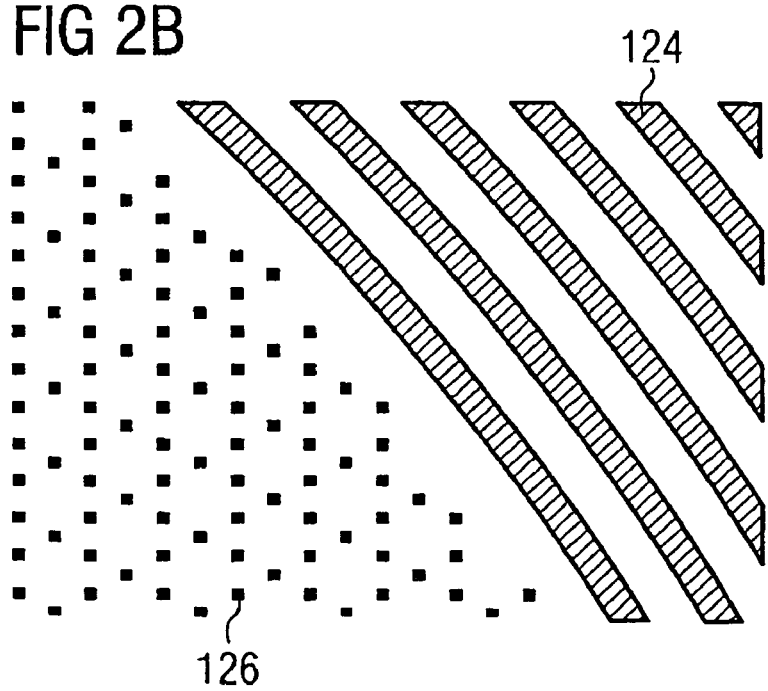
FIG. 2B is a detailed view of a portion of the membrane shown in FIG. 2A.

FIG. 2B is an increased representation of the membrane shown in FIG. 2A with the corrugation grooves 124 and the bumps 126. The corrugation grooves have a width of about 5 μm and the bumps have a width of about 1 μm. Preferably, the counter electrode comprises a plurality of openings and the arrangement of the bumps matches these openings.

The present invention, as it has been described above with reference to the preferred embodiment in FIGS. 1 and 2, is not limited to these embodiments. Rather, the membrane 120 can also have other forms, e.g. square forms, and the corrugation grooves 124 are also not limited to the described circular design. Rather, the corrugation grooves can also be formed by a traverse or by several portions separated from one another.

Further, it has been illustrated in the above-described embodiment that a second sacrificial oxide layer 116 is deposited on the first sacrificial layer. In another embodiment, the membrane can also be deposited directly on the first sacrificial oxide layer 106.

Although the description of the above embodiment was made with regard to a silicon microphone, it should be noted that the present invention is not limited to this application. Rather, the present invention is suitable for all devices where a membrane is provided, which needs to have a certain sensitivity and where adhesion to a counter electrode is to be avoided. Other fields of application comprise, for example, pressure sensors etc.

Figure 3:
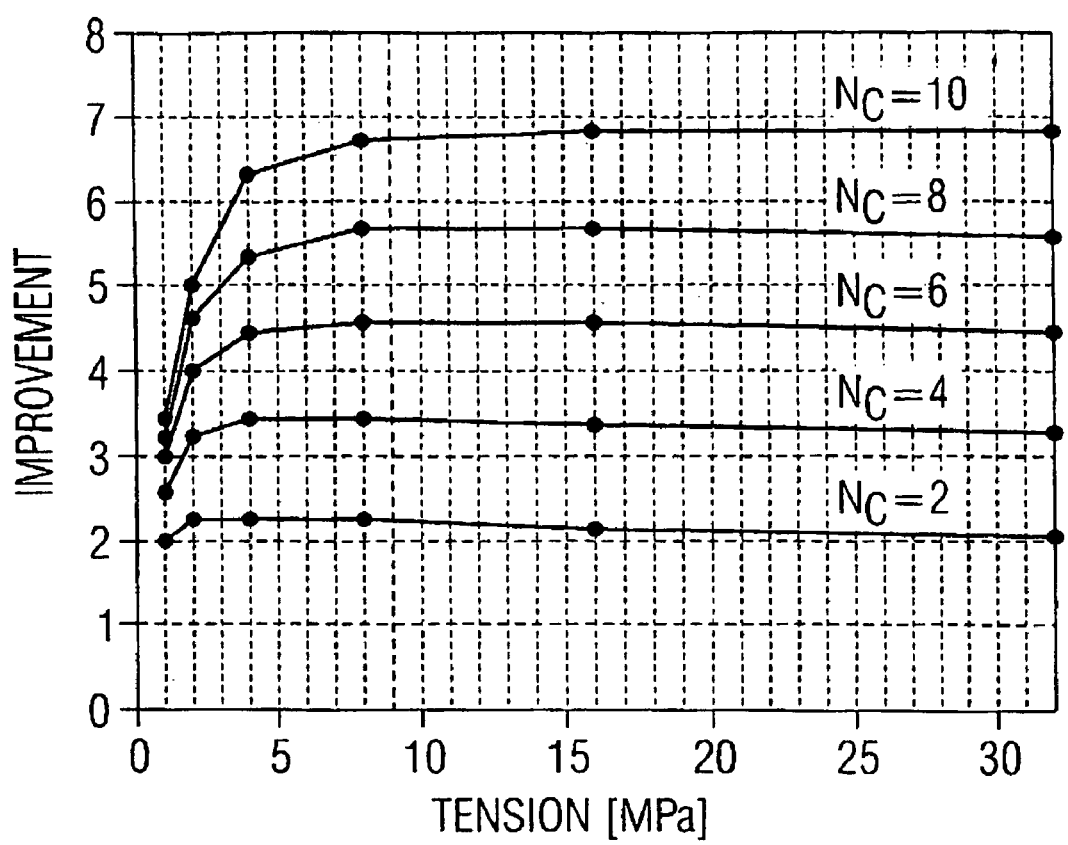
FIG. 3 is a graph indicating the improvement of sensitivity of the inventive microphone membrane in dependence on the number of corrugation grooves.

In the following, it will be discussed in more detail with reference to FIG. 3 in what way an improvement of sensitivity of a membrane is achieved due to the corrugation grooves. The membrane layer 120 is under tensile stress, which determines the sensitivity of the membrane 120 significantly. The corrugation groove serves for relaxing this layer stress. Here, it can be shown that the increase of sensitivity is in large areas proportional to the number of introduced corrugation grooves $N_c$. In the graph illustrated in FIG. 3, which is based on an FEM analysis (FEM=finite element method), the increase in sensitivity is illustrated in relation to the one of a circular membrane 120, as it is, for example, shown in FIG. 2. As can be seen from the illustration shown in FIG. 3, the sensitivity can already be doubled by using only two corrugation grooves ($N_c=2$).

For a more exact description of the sensitivity of a corrugation membrane its geometry has to be considered. In FIG. 4A, a circular corrugation membrane is illustrated, similar to the one shown in FIG. 2, wherein in FIG. 4A the radius R of the membrane 102 is plotted. In the embodiment shown in FIG. 4A, the membrane comprises four corrugation grooves 124. Further, the distance $R_c$ is indicated in FIG. 4A between an edge of the corrugation membrane 120 as well as to the first corrugation groove adjacent to the edge, which means the distance between the outermost corrugation groove and the edge of the membrane 120.

Figure 4B:
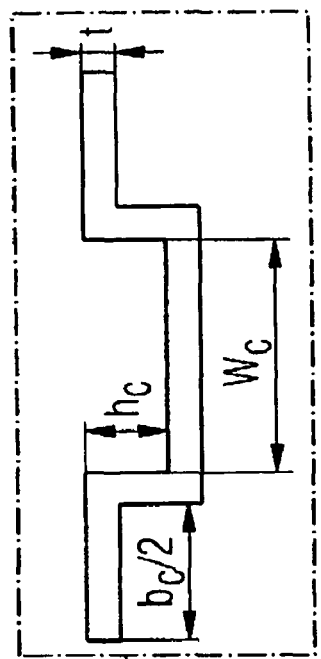
FIG. 4B is a cross section representation of a corrugation groove of a membrane of FIG. 4A.
Figure 4A:
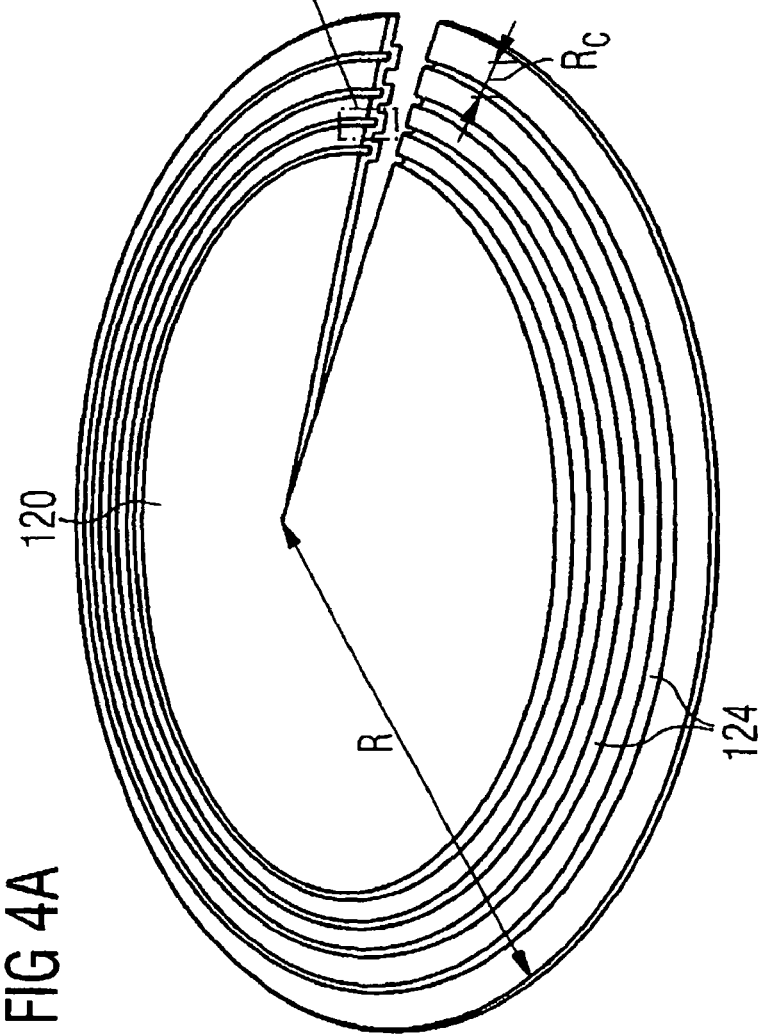
FIG. 4A is a representation of a corrugation membrane with the parameter required for determining the sensitivity.

In FIG. 4B, a cross section of a corrugation groove as formed in FIG. 4A is illustrated, wherein $w_c$ indicates the width of the corrugation groove, $h_c$ the depth of the corrugation groove, t the thickness of the membrane 120 and $b_c/2$ half of the distance of the considered corrugation groove to the adjacent corrugation groove.

With the above-described notation as indicated also in FIG. 4, a relation for the effective tension $\sigma_c$ in the membrane 120 in FIG. 4A can be indicated as follows:

$$\sigma_c = \frac{\sigma_0}{1 + 2{,}55 \cdot \frac{h_c^2}{t^2} \cdot \frac{(b_c + w_c) \cdot N_c}{R - R_c - (b_c + w_c) \cdot N_c}}$$

In the above equation, $\sigma_0$ is the layer tension of the membrane material. As can be seen from the equation, the increase of sensitivity of a corrugate membrane is based on a lower effective mechanical tension in the membrane 120.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

REFERENCE NUMBER LIST

100 substrate
102 surface of the substrate
104 counter electrode
106 first oxide layer
108 surface of the first sacrificial oxide layer
110 first plurality of recesses
112 second plurality of recesses
116 second sacrificial oxide layer
118 recesses of the second sacrificial oxide layer
120 membrane
122 recess in the membrane
124 corrugation grooves
126 antistick elements
128 cavity
129 support structure

The invention claimed is:

1. A method for producing a membrane for a device, comprising the following steps:
   (a) providing a substrate with a counter electrode disposed on the substrate, wherein a sacrificial layer is disposed on a surface of the counter electrode facing away from the substrate;
   (b) structuring the surface of the sacrificial layer facing away from the counter electrode to form a plurality of recesses in the surface to define at least one antistick element and at least one corrugation groove at the same time;
   (c) depositing a membrane material on the structured surface of the sacrificial layer; and
   (d) removing the sacrificial layer to form the membrane having at least one corrugation groove and at least one antistick element.

2. The method of claim 1, wherein in the step (b) the at least one antistick element is defined in a region of the sacrificial layer opposing a central region of the counter electrode, and wherein the at least one corrugation groove is defined in a region of the sacrificial layer opposing an edge region of the counter electrode, so that during a deflection of the membrane to the counter electrode the at least one antistick element comes into contact with the counter electrode.

3. The method of claim 2, comprising the followings step between step (b) and step (c):
   depositing a further sacrificial layer on the structured surface of the sacrificial layer with a thickness, which is low compared to a thickness of the sacrificial layer, so that the structured surface of the sacrificial layer is mapped onto a surface of the further sacrificial layer facing away from the sacrificial layer,
   wherein the membrane material is deposited on the surface of the further sacrificial layer in step (c), and
   wherein the further sacrificial layer is removed in step (d).

4. The method of claim 2, wherein the sacrificial layer is removed in step (d) such that a portion of the sacrificial layer remains in a region outside the counter electrode to define a structure supporting the membrane spaced apart from the counter electrode.

5. The method of claim 2, wherein the sacrificial layer is structured in step (b) to define self-contained corrugation grooves, which surround anti-stick elements.

6. The method of claim 5, wherein the corrugation grooves are circular.

7. The method of claim 2, wherein the recesses defining the antistick elements have a lateral dimension, which is small compared to a lateral dimension of the recesses defining the corrugation grooves, so that when depositing the membrane material, the recesses defining the antistick elements are closed.

8. The method of claim 2, wherein the membrane material is silicon.

9. The method of claim 2, wherein the device is a microphone and wherein the membrane is a microphone membrane.

10. The method of claim 1, comprising the followings step between step (b) and step (c):
    depositing a further sacrificial layer on the structured surface of the sacrificial layer with a thickness, which is low compared to a thickness of the sacrificial layer, so that the structured surface of the sacrificial layer is mapped onto a surface of the further sacrificial layer facing away from the sacrificial layer,
    wherein the membrane material is deposited on the surface of the further sacrificial layer in step (c), and
    wherein the further sacrificial layer is removed in step (d).

11. The method of claim 1, wherein the sacrificial layer is removed in step (d) such that a portion of the sacrificial layer remains in a region outside the counter electrode to define a structure supporting the membrane spaced apart from the counter electrode.

12. The method of claim 1, wherein the sacrificial layer is structured in step (b) to define self-contained corrugation grooves, which surround anti-stick elements.

13. The method of claim 12, wherein the corrugation grooves are circular.

14. The method of claim 1, wherein the recesses defining the antistick elements have a lateral dimension, which is small compared to a lateral dimension of the recesses defining the corrugation grooves, so that when depositing the membrane material, the recesses defining the antistick elements are closed.

15. The method of claim 1, wherein the membrane material is silicon.

16. The method of claim 1, wherein the device is a microphone and wherein the membrane is a microphone membrane.

17. A method for producing a membrane for a device, comprising the following steps:
    (a) providing a substrate with a counter electrode disposed on the substrate, wherein a sacrificial layer is disposed on a surface of the counter electrode that faces away from the substrate;
    (b) structuring the surface of the sacrificial layer facing away from the counter electrode to form a plurality of recesses in the surface to define at least one antistick element and at least one corrugation groove at the same time;
    (c) depositing a membrane material on the structured surface of the sacrificial layer; and
    (d) removing the sacrificial layer to form the membrane having at least one corrugation groove and at least one antistick element;
    wherein the at least one antistick element is defined and the at least one corrugation groove is defined such that during a deflection of the membrane to the counter electrode the at least one antistick element comes into contact with the counter electrode.

* * * * *